US010673125B2

(12) United States Patent
Yamada et al.

(10) Patent No.: US 10,673,125 B2
(45) Date of Patent: *Jun. 2, 2020

(54) WIRELESS APPARATUS (71) Applicant: KABUSHIKI KAISHA TOSHIBA, Tokyo (JP)

(72) Inventors: Keiju Yamada, Kanagawa (JP); Makoto Sano, Kanagawa (JP); Makoto Higaki, Tokyo (JP); Koh Hashimoto, Kanagawa (JP); Akihiko Happoya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,105

(22) Filed: Jun. 3, 2019

(65) Prior Publication Data

US 2019/0288375 A1  Sep. 19, 2019

Related U.S. Application Data (63) Continuation of application No. 15/441,993, filed on Feb. 24, 2017, now Pat. No. 10,355,338.

(30) Foreign Application Priority Data

Aug. 18, 2016  (JP) .................. 2016-160709

(51) Int. Cl.
H01Q 1/22 (2006.01)
H01Q 13/10 (2006.01)
(Continued)

(52) U.S. Cl.
CPC ....... H01Q 1/2283 (2013.01); H01L 23/3114 (2013.01); H01L 23/48 (2013.01);
(Continued)

(58) Field of Classification Search
CPC .... H01Q 1/2283; H01Q 13/106; H01Q 13/16; H01L 23/552; H01L 23/3114;
(Continued)

(56) References Cited

U.S. PATENT DOCUMENTS 6,466,170 B2* 10/2002 Zhou ................. H01Q 1/243
343/700 MS
2002/0196191 A1* 12/2002 Ngounou Kouam ........
H01Q 13/106
343/700 MS (Continued)

FOREIGN PATENT DOCUMENTS

JP  2013-179449 A  9/2013
JP  2014-45247 A  3/2014

(Continued)

Primary Examiner — Hai V Tran
Assistant Examiner — Michael M Bouizza
(74) Attorney, Agent, or Firm — Finnegan, Henderson, Farabow, Garrett & Dunner, L.L.P.

(57) ABSTRACT

According to an embodiment, a wireless apparatus includes an interposer including a conductive portion; a semiconductor chip mounted on a component mounting surface of the interposer; a sealing resin on the component mounting surface and sealing the semiconductor chip; a conductive layer covering a surface of the sealing resin and a side surface of the interposer and electrically connected to the conductive portion; a first slot-shaped aperture on a principal surface portion of the conductive layer facing the component mounting surface; a second slot-shaped aperture on a side surface portion of the conductive layer facing the side surface and continuing to the first aperture; and a slot-shaped aperture at the conductive portion and continuing to the second aperture. The first to third apertures function as an integrated slot antenna. A total length of the first aperture is longer than a total length of the third aperture.

11 Claims, 5 Drawing Sheets (51) Int. Cl.
*H01Q 13/16* (2006.01)
*H01L 23/552* (2006.01)
*H01L 23/48* (2006.01)
*H01L 23/498* (2006.01)
*H01L 23/31* (2006.01)
*H01L 23/66* (2006.01)

(52) U.S. Cl.
CPC .. *H01L 23/49811* (2013.01); *H01L 23/49822* (2013.01); *H01L 23/49838* (2013.01); *H01L 23/552* (2013.01); *H01L 23/66* (2013.01); *H01Q 13/106* (2013.01); *H01Q 13/16* (2013.01); *H01L 23/3121* (2013.01); *H01L 2223/6611* (2013.01); *H01L 2223/6677* (2013.01); *H01L 2924/3025* (2013.01)

(58) Field of Classification Search
CPC ............... H01L 23/49838; H01L 23/66; H01L 23/49811; H01L 2223/6677; H01L 2924/3025; H01L 2223/6611; H01L 23/3121; H01L 13/16
See application file for complete search history.

(56) References Cited

U.S. PATENT DOCUMENTS

| | | |
|---|---|---|
| 2013/0063313 A1 | 3/2013 | Ban et al. |
| 2013/0222196 A1 | 8/2013 | Hashimoto et al. |
| 2014/0055939 A1 | 2/2014 | Hashimoto et al. |
| 2014/0218250 A1 | 8/2014 | Kim et al. |
| 2014/0325150 A1 | 10/2014 | Hashimoto et al. |

FOREIGN PATENT DOCUMENTS

| | | |
|---|---|---|
| JP | 2014-217014 A | 11/2014 |
| JP | 5710558 B2 | 4/2015 |

\* cited by examiner

//* WIRELESS APPARATUS

CROSS-REFERENCE TO RELATED APPLICATIONS

This application is a continuation of U.S. application Ser. No. 15/441,993, filed Feb. 24, 2017, which is based upon and claims the benefit of priority from Japanese Patent Application No. 2016-160709, filed on Aug. 18, 2016; the entire contents of which Applications are incorporated herein by reference.

FIELD

Embodiments described herein relate generally to a wireless apparatus.

BACKGROUND

A method has been known in the past in which a surface of sealing resin that seals a semiconductor chip is covered with a conductive layer in order to give a shielding function to a semiconductor package of the semiconductor chip mounted on an interposer. Meanwhile, a technique for implementing an internal antenna module has been proposed in which an aperture extending to a conductive portion of an interposer from a principal surface portion of a conductive layer for shielding (a surface facing a component mounting surface of the interposer) via a side surface portion thereof (a surface facing a side surface of the interposer) is provided to cause this aperture to function as a slot antenna.

However, according to the conventional technique, approximately a half of the slot antenna is constituted by the aperture provided at the conductive portion of the interposer and thus, the interposer has a large antenna-occupied area by the aperture portion. As a result, an area of an antenna section where a wiring pattern for a signal line cannot be provided increases at the conductive portion of the interposer, thereby having caused a problem in which reduction in size of the interposer is difficult to achieve.

DETAILED DESCRIPTION

According to an embodiment, a wireless apparatus includes an interposer, a semiconductor chip, a sealing resin, a conductive layer, at least one first slot aperture, at least one second slot aperture, and at least one third slot aperture. The interposer includes a conductive portion. The semiconductor chip is mounted on a component mounting surface of the interposer. The sealing resin is provided on the component mounting surface of the interposer and seals the semiconductor chip. The conductive layer covers a surface of the sealing resin and a side surface of the interposer and is electrically connected to the conductive portion of the interposer. The first slot aperture is provided on a principal surface portion of the conductive layer facing the component mounting surface of the interposer. The second slot aperture is provided on a side surface portion of the conductive layer facing the side surface of the interposer and continues to the first slot aperture. The third slot aperture is provided at the conductive portion of the interposer and continues to the second slot aperture. The first slot aperture, the second slot aperture, and the third slot aperture function as a slot antenna. A total length of the first slot aperture is longer than a total length of the third slot aperture.

Embodiments will be described in detail below with reference to the accompanying drawings. Note that, in the following description, constituent members having similar functions will be denoted by the same reference numeral and the duplicated description will be omitted as appropriate.

First Embodiment

Figure 1:
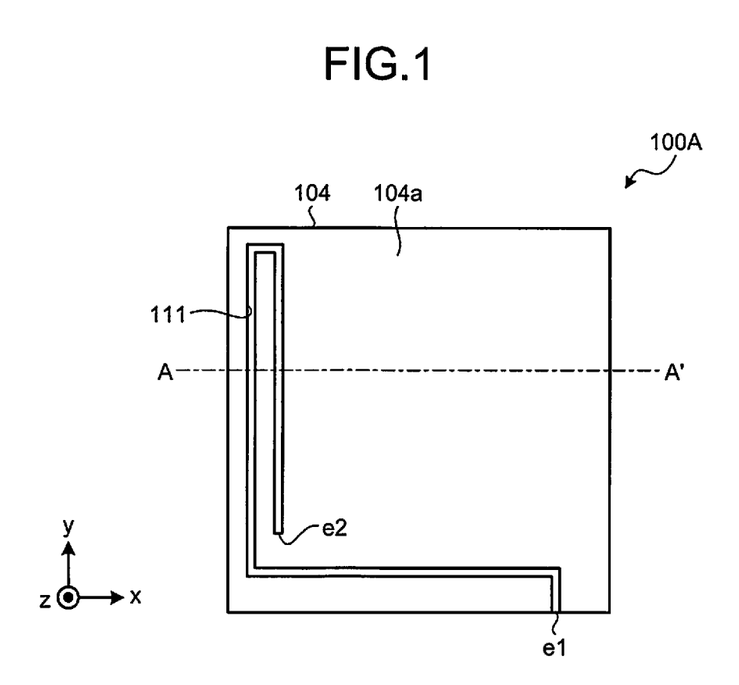
FIG. 1 is a top view of a wireless apparatus according to a first embodiment.
Figure 2:
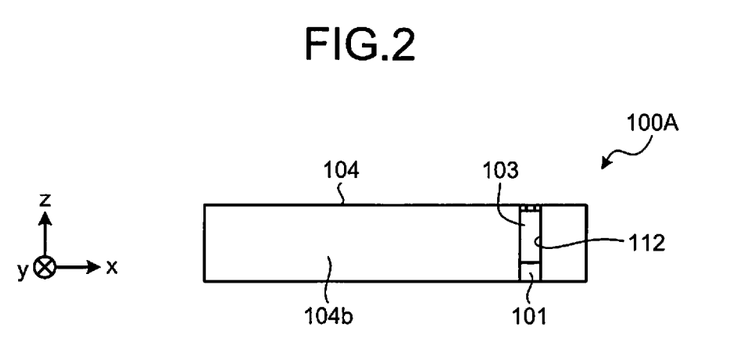
FIG. 2 is a lateral view of the wireless apparatus according to the first embodiment.
Figure 3:
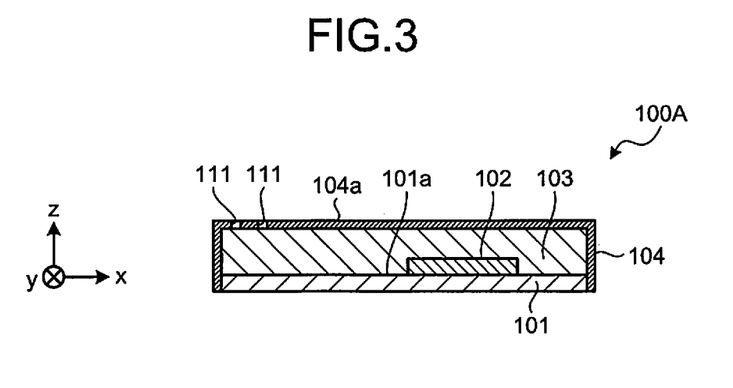
FIG. 3 is a cross-sectional view of the wireless apparatus according to the first embodiment.
Figure 4:
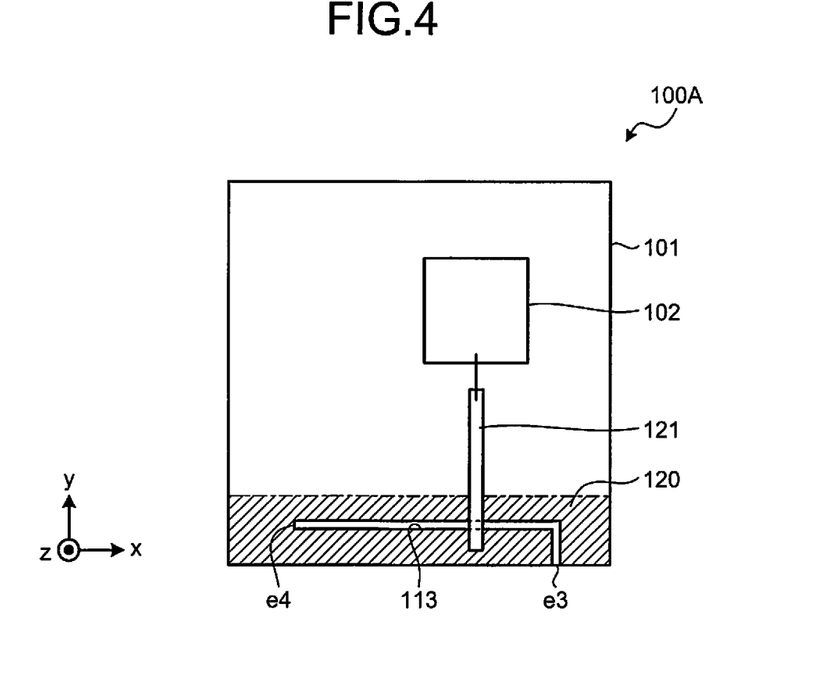
FIG. 4 is a view for explaining a third slot aperture.

First, a wireless apparatus 100A according to a first embodiment will be described with reference to FIG. 1 to FIG. 4. FIG. 1 is a top view of the wireless apparatus 100A according to the first embodiment when viewed from a z-axis direction in FIG. 1; FIG. 2 is a lateral view of the wireless apparatus 100A according to the first embodiment when viewed from a y-axis direction in FIG. 2; FIG. 3 is a cross-sectional view when a cross-section taken along a line segment A-A' in FIG. 1 is viewed from the y-axis direction in FIG. 3; and FIG. 4 is a view for explaining a third slot aperture provided at a conductive portion of an interposer.

The wireless apparatus 100A according to the embodiment is configured such that a semiconductor chip 102 mounted on an interposer 101 is sealed with sealing resin 103 and surfaces of the sealing resin 103 and side surfaces of the interposer 101 are covered with a conductive layer 104. The wireless apparatus 100A having such a configuration is called a semiconductor package or a module with a shielding function.

The interposer 101 is a substrate obtained by forming a conductive portion made of a metal material such as copper on an insulating layer insulating layer and has a function as a relay member for connecting a component such as the semiconductor chip 102 mounted on this interposer 101 to a larger circuit substrate than a circuit substrate in which the wireless apparatus 100A is to be mounted. Such conductors of the interposer 101 are provided at least on a side of a component mounting surface 101a on which a component such as the semiconductor chip 102 is mounted and on a side of a back surface on an opposite side of this component mounting surface 101a (a surface to be located on a side of the aforementioned circuit substrate). Some interposers 101 have a multilayer structure provided with one or more layers of the conductive portions between these surfaces as well. A wiring pattern, a ground, and so on of the interposer 101 are provided at these conductors. FIG. 4 exemplifies, as a conductive portion 120, a part of the ground provided adjacent to the side surface of the interposer 101.

The semiconductor chip 102 is configured by forming metal patterns made of, for example, copper, aluminum, or gold in or on an outermost layer of a semiconductor substrate made of a material such as silicon, silicon germanium, or gallium arsenide and has therein a transmission/reception circuit for transmitting and receiving a signal. The semiconductor chip 102 is mounted on the component mounting surface 101a of the interposer 101 to be electrically connected thereto via the wiring pattern, the ground, a bonding wire, a bump, and so on of the interposer 101.

Note that the semiconductor chip 102 may be composed of a dielectric substrate, a magnetic material substrate, a metal, or a combination thereof. Meanwhile, the semiconductor chip 102 may be configured as a chip size package (CSP). Although FIG. 3 and FIG. 4 show an example where the single semiconductor chip 102 is mounted on the interposer 101, a configuration with the plurality of semiconductor chips 102 mounted on the interposer 101 may be employed. In this case, the plurality of semiconductor chips 102 may be mounted in a stacked state, or alternatively, may be mounted by being placed side by side. Furthermore, although FIG. 3 and FIG. 4 show an example where the single semiconductor chip 102 is mounted on the interposer 101, other components such as capacitors, resistances, inductors, crystal oscillators and an IC may be mounted on the interposer 101 in addition to the semiconductor chip 102.

The sealing resin 103 is made of a thermosetting formation material obtained by, for example, adding a silica filler or the like to epoxy resin serving as a main component and, for the purpose of the protection of the semiconductor chip 102, arranged on the component mounting surface 101a of the interposer 101 to seal the semiconductor chip 102. The sealing resin 103 is an example of a sealing resin to seal the semiconductor chip 102. The sealing resin is not limited to resin and may be configured by using another non-conductive material or an insulating material.

The conductive layer 104 is made of a metal material with high conductivity such as copper and silver or a conductive paste that is a mixture of a metal material such as silver and an insulating material such as the epoxy resin, and is formed as a film covering the surface of the sealing resin 103 (a surface on an outer side) and the side surface of the interposer 101. That is, the wireless apparatus 100A according to the embodiment has a configuration in which an entire surface of the interposer 101 except the back surface thereof is covered with the conductive layer 104. In the present specification, a surface of the conductive layer 104 facing the component mounting surface 101a of the interposer 101 is called a principal surface portion 104a of the conductive layer 104 (refer to FIG. 1). Additionally, surfaces of the conductive layer 104 facing the side surfaces of the interposer 101 are called side surface portions 104b of the conductive layer 104 (refer to FIG. 2).

Although the illustration is omitted, a base film made of stainless steel, titanium, or the like is formed between the sealing resin 103 and the conductive layer 104 in order to prevent the conductive layer 104 from peeling off. In addition, for the purpose of preventing oxidation and corrosion, a cap layer made of stainless steel, titanium, or the like is formed on a surface of the conductive layer 104.

The conductive layer 104 has a shielding function that suppresses a leakage of a high frequency electromagnetic wave (several tens of megahertz to several gigahertz) mainly generated from the semiconductor chip 102 to the outside of the wireless apparatus 100A as radiation noise. A shielding effectiveness by the conductive layer 104 depends on a sheet resistance value obtained by dividing the resistivity of the conductive layer 104 by the thickness of the conductive layer 104. In order to be able to suppress the leakage of the radiation noise, it is desirable to configure the conductive layer 104 to have the sheet resistance value equal to or lower than 0.5Ω.

Meanwhile, the conductive layer 104 is electrically connected to the conductive portion 120 of the interposer 101. That is, because the conductive layer 104 does not cover the surface of the sealing resin 103 but also the side surfaces of the interposer 101, the conductive layer 104 is in contact with the conductive portion 120 serving as the ground on the side surface of the interposer 101 and thus, electrically connected to the conductor 120. The conductive layer 104 is connected to the ground of the interposer 101 with a low resistance, thereby obtaining high shielding effectiveness.

In the wireless apparatus 100A according to the embodiment, a slot antenna is constituted by a slot aperture (a slit) provided from the conductive layer 104 up to the conductive portion 120 of the interposer 101. Specifically, as shown in FIG. 1, a first slot aperture 111 is provided on the principal surface portion 104a of the conductive layer 104. In addition, as shown in FIG. 2, a second slot aperture 112 continuing to the first slot aperture 111 is provided on the side surface portion 104b of the conductive layer 104. Besides, as shown in FIG. 4, a third slot aperture 113 continuing to the second slot aperture 112 is provided at the conductive portion 120 of the interposer 101.

The second slot aperture 112 is provided on the side surface portion 104b of the conductive layer 104 in such a manner that an end portion on an upper side in FIG. 2 is joined to one end portion e1 of the first slot aperture 111 shown in FIG. 1 and an end portion on a lower side in FIG. 2 is joined to one end portion e3 of the third slot aperture 113 shown in FIG. 4. Accordingly, the first slot aperture 111, the second slot aperture 112, and the third slot aperture 113 constitute a slot aperture. Additionally, a length (a slot length) from another end portion e2 of the first slot aperture 111 shown in FIG. 1 to another end portion e4 of the third slot aperture 113 shown in FIG. 4 is set to correspond to approximately a half wavelength of a desired frequency used in the communication by the wireless apparatus 100A.

Meanwhile, as shown in FIG. 4, the third slot aperture 113 is provided at the conductive portion 120 of the interposer 101 in such a manner as to intersect an antenna feeder 121 joined to the semiconductor chip 102 mounted on the interposer 101. Thus, the integrated slot aperture constituted by the first slot aperture 111, the second slot aperture 112, and the third slot aperture 113 functions as the slot antenna when electricity is supplied by the antenna feeder 121 through electromagnetic coupling feeding (or coplanar feeding), thereby being able to efficiently radiate or receive the electromagnetic wave at the desired frequency.

The first slot aperture 111 and the second slot aperture 112 are formed by forming the conductive layer 104 so as to cover the surface of the sealing resin 103 and the side surfaces of the interposer 101 and thereafter, carrying out cutting processing on the principal surface portion 104a and the side surface portion 104b of the conductive layer 104 by using, for example, a laser machine or an end milling machine. The third slot aperture 113 is formed simultaneously with forming the wiring pattern and the like on the conductive portion 120 of the interposer 101.

Here, in the wireless apparatus 100A according to the embodiment, among the slot apertures constituting the slot antenna, the total length of the first slot aperture 111 provided on the principal surface portion 104a of the conductive layer 104 is made longer than the total length of the third slot aperture 113 provided at the conductive portion 120 of the interposer 101. In other words, a length from the one end portion e1 to the another end portion e2 of the first slot aperture 111 shown in FIG. 1 is longer than a length from the one end portion e3 to the another end portion e4 of the third slot aperture 113 shown in FIG. 4.

Because the third slot aperture 113 is provided at the conductive portion 120 of the interposer 101, a section of the conductive portion 120 of the interposer 101 where the third slot aperture 113 is provided is deemed as an antenna section where the wiring pattern cannot be provided. As described above, the length of the slot apertures constituting the slot antenna (slot length) is determined on the basis of the frequency used in the communication by the wireless apparatus 100A. Accordingly, in the case of employing a configuration where the third slot aperture 113 contributes to a large part of this length, an area of the antenna section increases with respect to the conductive portion 120 of the interposer 101 and acts as a primary factor hindering reduction in size of the interposer 101 and in turn, reduction in size of the wireless apparatus 100A.

In contrast to this, in the wireless apparatus 100A according to the embodiment, the total length of the first slot aperture 111 is made longer than the total length of the third slot aperture 113 such that the first slot aperture 111 contributes to a large part of the slot length of the slot antenna. Therefore, an area of the antenna section is made smaller with respect to the conductive portion 120 of the interposer 101, whereby reduction in size of the interposer 101 can be achieved.

In addition, in the wireless apparatus 100A according to the embodiment, the first slot aperture 111 is provided on the principal surface portion 104a of the conductive layer 104 at a position not overlapping the semiconductor chip 102. In other words, the first slot aperture 111 is not provided at a section of the principal surface portion 104a of the conductive layer 104 located just above the semiconductor chip 102 mounted on the interposer 101 but an entire surface of the section just above the semiconductor chip 102 is covered with the conductive layer 104.

As described above, when the first slot aperture 111 is configured to contribute to a large part of the slot length of the slot antenna, an aperture area relative to the conductive layer 104 increases and thus, concerns about a decrease in the shielding effectiveness by the conductive layer 104 occur. However, by providing the first slot aperture 111 on the principal surface portion 104a of the conductive layer 104 at a position not overlapping the semiconductor chip 102, a decrease in the shielding effectiveness by the conductive layer 104 can be effectively suppressed. That is, the electromagnetic wave to be shielded by the conductive layer 104 is predominantly generated from the semiconductor chip 102 and accordingly, when the first slot aperture 111 is provided by avoiding the section located just above the semiconductor chip 102 to obtain a configuration where the section just above the semiconductor chip 102 is covered with the conductive layer 104, a decrease in the shielding effectiveness can be reduced. In particular, as shown in FIG. 1, when the first slot aperture 111 is provided so as to extend along an end edge of the principal surface portion 104a of the conductive layer 104 at a position close to the end edge (a boundary with the side surface portion 104b) such that the position of the first slot aperture 111 is set to a position as far away from the section located just above the semiconductor chip 102 as possible, a high shielding effectiveness can be obtained even with the first slot aperture 111 having a longer total length.

In addition, in the case of employing a configuration where the first slot aperture 111 is provided on the principal surface portion 104a of the conductive layer 104 at a position not overlapping the semiconductor chip 102, an effect is also obtained in which the first slot aperture 111 can be formed without damaging the semiconductor chip 102. Specifically, in a case where the first slot aperture 111 is formed by carrying out the cutting processing on the principal surface portion 104a of the conductive layer 104 by using the laser machine, there are concerns about damage to the semiconductor chip 102 due to laser light when the semiconductor chip 102 is located just under a position to be irradiated with the laser light. In contrast to this, with a configuration where the first slot aperture 111 is provided on the principal surface portion 104a of the conductive layer 104 at a position not overlapping the semiconductor chip 102, the section just above the semiconductor chip 102 is not irradiated with the laser light during the cutting processing using the laser machine and consequently, damage to the semiconductor chip 102 is not caused by the laser light.

Figure 5:
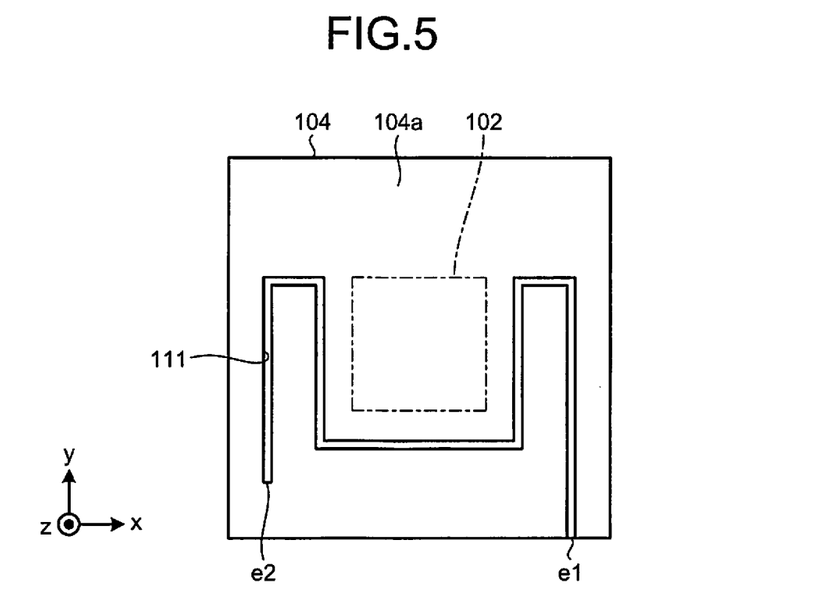
FIG. 5 is a view for explaining another example of a first slot aperture.

The shape of the first slot aperture 111 shown in FIG. 1 serves as an example and is not limited thereto. The first slot aperture 111 is only required to be provided on the principal surface portion 104a of the conductive layer 104 such that the total length thereof, namely, a length from the one end portion e1 to the another end portion e2 is longer than the total length of the third slot aperture 113 and the section just above the semiconductor chip 102 is avoided (so as not to overlap the semiconductor chip 102). In a case where the semiconductor chip 102 is configured to be arranged at the center of the interposer 101, as shown in FIG. 5 as an example, the first slot aperture 111 can be provided on the principal surface portion 104a of the conductive layer 104 by avoiding the section just above the semiconductor chip 102 located at the center.

The wireless apparatus 100A according to the embodiment described above is configured as a package or a module provided with, for example, a ball grid array (BGA) structure where a terminal formed by a solder ball is provided on a back surface side of the interposer 101. Alternatively, the wireless apparatus 100A may be configured as a package or a module having a land grid array (LGA) structure where a land on the back surface side of the interposer 101 is used as a terminal while the terminal by the solder ball is not provided. Note that, although the planar shape of the wireless apparatus 100A exemplified in FIG. 1 to FIG. 4 has a quadrangular shape, an outer shape of the wireless apparatus 100A is not limited to this example and can be set to various shapes.

As described above, the wireless apparatus 100A according to the embodiment is configured in such a manner that the first slot aperture 111 provided on the principal surface portion 104a of the conductive layer 104, the second slot aperture 112 provided on the side surface portion 104b of the conductive layer 104, and the third slot aperture 113 provided at the conductive portion 120 of the interposer 101 are joined to one another so as to function as an integrated slot antenna. Additionally, the total length of the first slot aperture 111 provided on the principal surface portion 104a of the conductive layer 104 is made longer than the total length of the third slot aperture 113 provided at the conductive portion 120 of the interposer 101. Therefore, according to the embodiment, an area of the antenna section is made smaller with respect to the conductive portion 120 of the interposer 101, whereby reduction in size of the interposer 101 can be achieved and also reduction in size of the wireless apparatus 100A itself can be achieved.

Furthermore, according to the embodiment, the first slot aperture 111 is configured to be provided on the principal surface portion 104a of the conductive layer 104 at a position not overlapping the semiconductor chip 102 and thus, a decrease in the shielding effectiveness by the conductive layer 104 can be effectively suppressed, while damage to the semiconductor chip 102 caused during the processing on the first slot aperture 111 can be effectively prevented.

Second Embodiment

Figure 6:
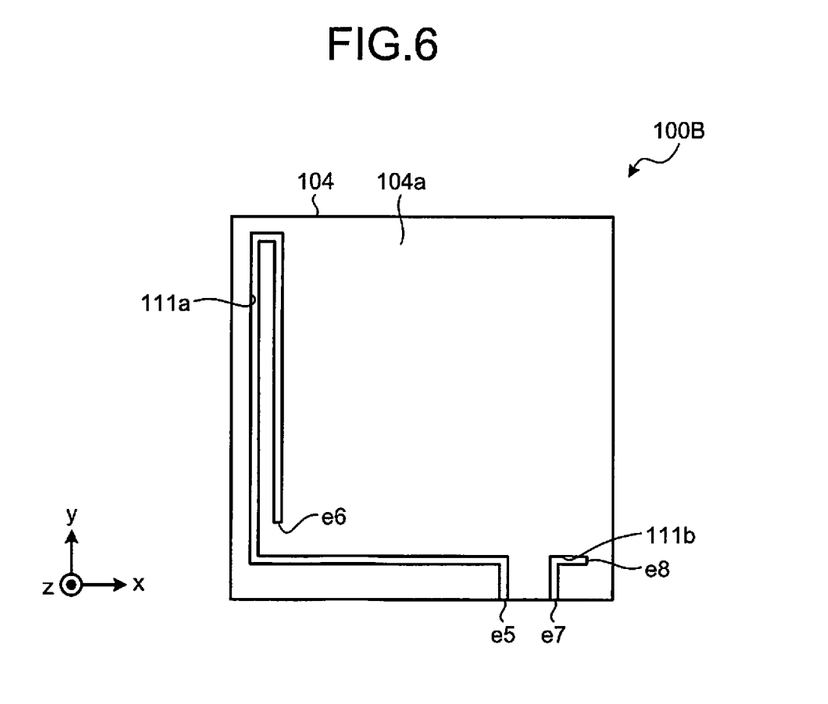
FIG. 6 is a top view of a wireless apparatus according to a second embodiment.
Figure 7:
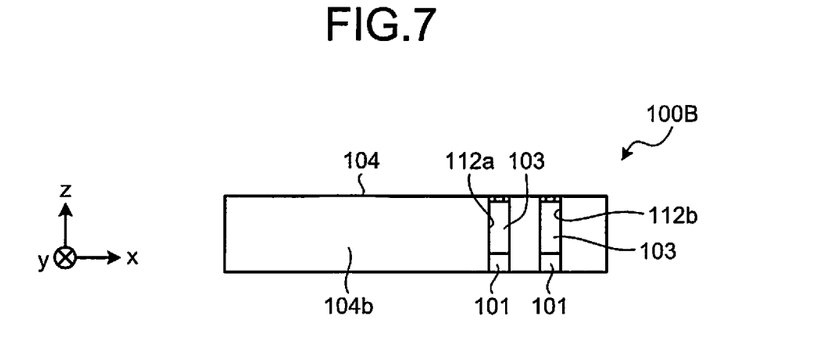
FIG. 7 is a lateral view of the wireless apparatus according to the second embodiment.
Figure 8:
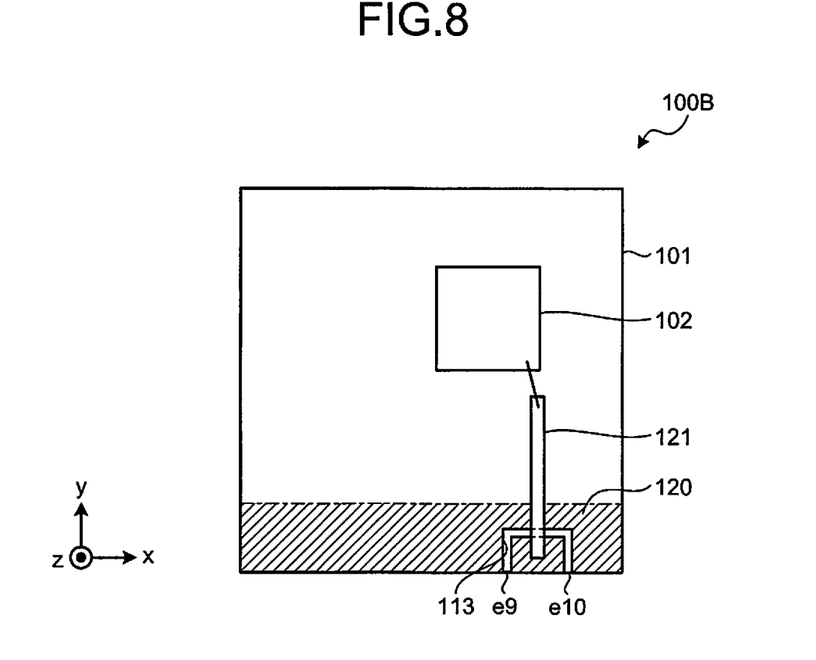
FIG. 8 is a view for explaining a third slot aperture.

Next, a wireless apparatus 100B according to a second embodiment will be described with reference to FIG. 6 to FIG. 8. FIG. 6 is a top view of the wireless apparatus 100B according to the second embodiment when viewed from a z-axis direction in FIG. 6; FIG. 7 is a lateral view of the wireless apparatus 100B according to the second embodiment when viewed from a y-axis direction in FIG. 7; and FIG. 8 is a view for explaining a third slot aperture provided at a conductive portion of an interposer. Note that a cross-sectional view of the wireless apparatus 100B according to the second embodiment is omitted since it is similar to the cross-sectional view shown in FIG. 3.

The wireless apparatus 100B according to the second embodiment has a basic structure configured similarly to the wireless apparatus 100A according to the first embodiment but has a configuration of the slot antenna different from that of the wireless apparatus 100A according to the first embodiment. Specifically, in the wireless apparatus 100B according to the second embodiment, two first slot apertures 111a and 111b are provided on a principal surface portion 104a of a conductive layer 104 as shown in FIG. 6. In addition, as shown in FIG. 7, two second slot apertures, namely, a second slot aperture 112a continuing to the first slot aperture 111a and a second slot aperture 112b continuing to the first slot aperture 111b are provided on a side surface portion 104b of the conductive layer 104. Besides, as shown in FIG. 8, a third slot aperture 113 continuing to the two second slot apertures 112a and 112b is provided at a conductive portion 120 of an interposer 101 in a shape to join these two second slot apertures 112a and 112b to each other.

One of the two second slot apertures 112a and 112b, specifically, the second slot aperture 112a is provided on the side surface portion 104b of the conductive layer 104 in such a manner that an end portion on an upper side in FIG. 7 is joined to one end portion e5 of the first slot aperture 111a shown in FIG. 6 and an end portion on a lower side in FIG. 7 is joined to one end portion e9 of the third slot aperture 113 shown in FIG. 8. The other of the two second slot apertures 112a and 112b, specifically, the second slot aperture 112b is provided on the side surface portion 104b of the conductive layer 104 in such a manner that an end portion on the upper side in FIG. 7 is joined to one end portion e7 of the first slot aperture 111b shown in FIG. 6 and an end portion on the lower side in FIG. 7 is joined to another end portion e10 of the third slot aperture 113 shown in FIG. 8. Accordingly, the two first slot apertures 111a and 111b, the two second slot apertures 112a and 112b, and the third slot aperture 113 constitute an integrated continuous slot aperture. Additionally, a length from another end portion e6 of the first slot aperture 111a shown in FIG. 6 to another end portion e8 of the first slot aperture 111b (slot length) is set to correspond to substantially a half wavelength of a desired frequency used in the communication by the wireless apparatus 100B.

Furthermore, as shown in FIG. 8, the third slot aperture 113 is provided at the conductive portion 120 of the interposer 101 in such a manner as to intersect an antenna feeder 121 joined to a semiconductor chip 102 mounted on the interposer 101. Thus, the integrated slot aperture constituted by the two first slot apertures 111a and 111b, the two second slot apertures 112a and 112b, and the third slot aperture 113 functions as the slot antenna when electricity is supplied by the antenna feeder 121 through electromagnetic coupling feeding, thereby being able to efficiently radiate or receive the electromagnetic wave at the desired frequency.

Alternatively, one of the two second slot apertures 112a and 112b can be provided on one of the plurality of side surface portions 104b of the conductive layer 104, while providing the other thereof on another side surface portion 104b. However, as shown in FIG. 7, when the two second slot apertures 112a and 112b are configured to be provided on one and the same side surface portion 104b of the conductive layer 104, the second slot apertures 112a and 112b can be processed in a simple and easy manner. Specifically, in a case where the second slot apertures 112a and 112b are formed by carrying out the cutting processing on the side surface portion 104b of the conductive layer 104 by using the end milling machine, when a configuration where the two second slot apertures 112a and 112b are provided on one and the same side surface portion 104b of the conductive layer 104 is employed, the two second slot apertures 112a and 112b can be formed through one process without rotating the wireless apparatus 100B.

Also in the wireless apparatus 100B according to the second embodiment, among the slot apertures constituting the slot antenna, the total length of the first slot apertures 111a and 111b provided on the principal surface portion 104a of the conductive layer 104 is made longer than the total length of the third slot aperture 113 provided at the conductive portion 120 of the interposer 101. In other words, a sum of a length from the one end portion e5 to the another end portion e6 of the first slot aperture 111a and a length from the one end portion e7 to the another end portion e8 of the first slot aperture 111b shown in FIG. 6 is longer than a length from the one end portion e9 to the another end portion e10 of the third slot aperture 113 shown in FIG. 8. Therefore, also in the second embodiment, an area of the antenna section is made smaller with respect to the conductive portion 120 of the interposer 101, whereby an effect that achieves reduction in size of the interposer 101 can be obtained as in the first embodiment.

In addition, also in the wireless apparatus 100B according to the second embodiment, the first slot apertures 111a and 111b are provided on the principal surface portion 104a of the conductive layer 104 at positions not overlapping the semiconductor chip 102. Consequently, also in the second embodiment, an effect is obtained as in the first embodiment in which a decrease in the shielding effectiveness by the conductive layer 104 can be effectively suppressed, while damage to the semiconductor chip 102 caused during the processing on the first slot apertures 111a and 111b can be effectively prevented.

Additionally, in the configuration according to the second embodiment, the another end portion e6 of one of the two first slot apertures 111a and 111b shown in FIG. 6, specifically, the first slot aperture 111a (an end portion on an opposite side of the end portion e5 located on a side of the second slot aperture 112a) serves as one end portion of the slot antenna, whereas the another end portion e8 of the other thereof, specifically, the first slot aperture 111b (an end portion on an opposite side of the end portion e7 located on a side of the second slot aperture 112b) serves as another end portion of the slot antenna. In short, both of the end portions of the slot antenna are configured to be arranged on the principal surface portion 104a of the conductive layer 104.

With such a configuration, by adjusting the position of the another end portion e6 of the one first slot aperture 111a and the position of the another end portion e8 of the other first slot aperture 111b while the two first slot apertures 111a and 111b are formed on the principal surface portion 104a of the conductive layer 104, both of the adjustment of a resonance frequency of the slot antenna and the adjustment of impedance matching of the slot antenna can be carried out in a simple and easy manner.

Figure 9:
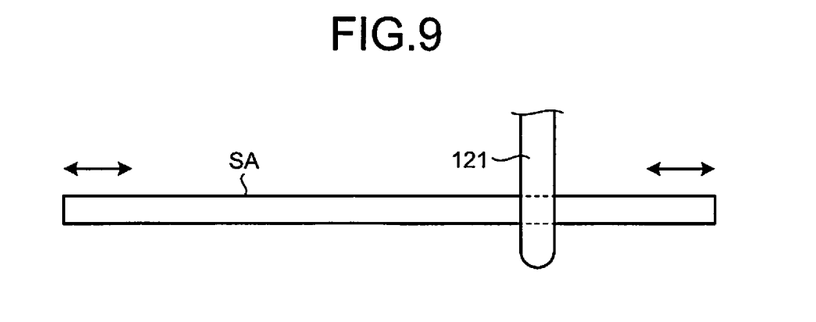
FIG. 9 is a conceptual view for explaining matching adjustment of a slot antenna.

FIG. 9 is a conceptual view for explaining matching adjustment of the slot antenna. Typically, as shown in FIG. 9, impedance adjustment for the slot antenna can be implemented by adjusting a relative position of the antenna feeder 121 in a slot length direction of the slot antenna (SA in FIG. 9). In the wireless apparatus 100B according to the second embodiment, the position of the antenna feeder 121 and the position of the third slot aperture 113 provided at the conductive portion 120 are fixed on the interposer 101 and accordingly, in order to adjust the relative position of the antenna feeder 121 in the slot length direction of the slot antenna, positions of both of the end portions of the slot antenna needs to be adjusted. In addition, as described earlier, the slot length of the slot antenna is designed to correspond to a half wavelength of a desired frequency. Actually, however, the dielectric constant within the conductive layer 104 varies depending on, for example, a state of the sealing resin 103 and the wavelength varies in turn. For this reason, the resonance frequency needs to be adjusted by adjusting the slot length of the slot antenna.

Here, in the second embodiment, both of the end portions of the slot antenna are arranged together on the principal surface portion 104a of the conductive layer 104 as the end portion e6 of the first slot aperture 111a and the end portion e8 of the first slot aperture 111b. Accordingly, the adjustment of the relative position of the antenna feeder 121 in the slot length direction of the slot antenna and the adjustment of the slot length of the slot antenna can be simultaneously carried out through position adjustment of these end portions e6 and e8. That is, both of the adjustment of the resonance frequency of the slot antenna and the adjustment of the impedance matching of the slot antenna can be carried out in a simple and easy manner.

Figure 10:
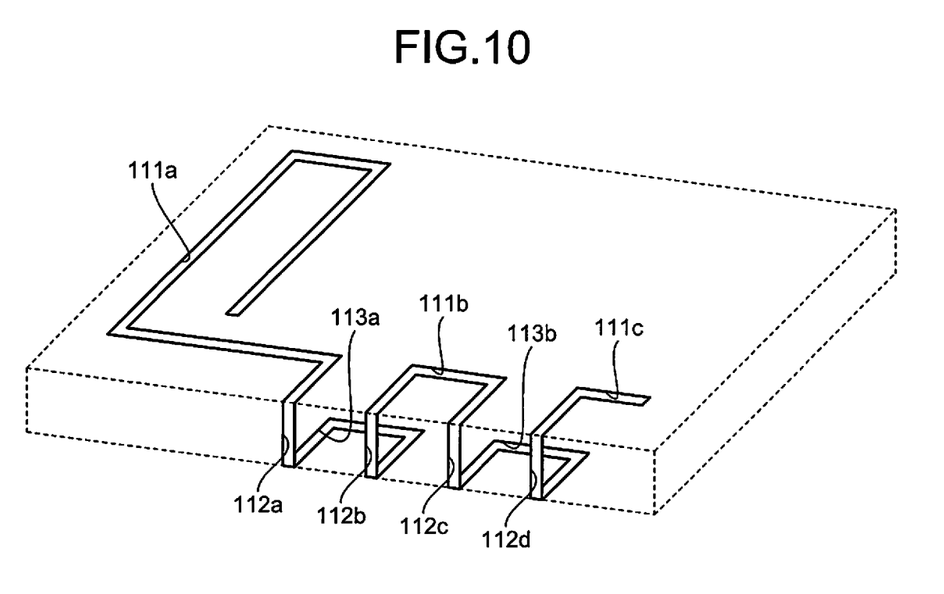
FIG. 10 is a view for explaining another example of the slot antenna.

The configuration of the slot antenna according to the second embodiment described above serves as an example and is not limited thereto. The slot antenna according to the second embodiment is only required to have a configuration in which a plurality of first slot apertures 111 provided on the principal surface portion 104a of the conductive layer 104, a plurality of second slot apertures 112 provided on the side surface portion 104b of the conductive layer 104, and at least the one third slot aperture 113 provided at the conductive portion 120 of the interposer 101 are joined to one another as an integrated unit. For example, as shown in FIG. 10, the slot antenna may be configured by joining three first slot apertures 111a, 111b, and 111c, four second slot apertures 112a, 112b, 112c, and 112d, and two third slot apertures 113a and 113b to one another as an integrated unit.

According to at least one of the embodiments described above, reduction in size of the interposer 101 can be achieved.

While certain embodiments have been described, these embodiments have been presented by way of example only, and are not intended to limit the scope of the inventions. Indeed, the novel embodiments described herein may be embodied in, a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless apparatus comprising:
an interposer including a conductive portion;
a semiconductor chip mounted on a component mounting surface of the interposer;
a sealing resin provided to contact with the interposer and seal the semiconductor chip;
a first conductive layer provided on a top surface of the sealing resin;
a second conductive layer provided on a side surface of the sealing resin; and
a slot antenna provided across the first conductive layer, the second conductive layer, and the conductive portion of the interposer, wherein
a first part of the slot antenna is longer than a second part of the slot antenna, the first part provided on the first conductive layer, the second part provided on the conductive portion of the interposer, and
the slot antenna has at least one bent-shape portion at the first conductive layer or the conductive portion of the interposer.

2. The apparatus according to claim 1, wherein
the top surface of the sealing resin being in parallel to the component mounting surface of the interposer, and
the side surface of the sealing resin being perpendicular to the component mounting surface of the interposer.

3. The apparatus according to claim 1, wherein
the slot antenna is not overlapped with the semiconductor chip when viewed in a vertical direction with respect to the top surface of the sealing resin.

4. The apparatus according to claim 1, wherein
both ends of the slot antenna are located on the first conductive layer.

5. A wireless apparatus comprising:
an interposer including a conductive portion;
a semiconductor chip mounted on a component mounting surface of the interposer;
a sealing resin provided to contact with the interposer and seal the semiconductor chip;
a first conductive layer provided on a top surface of the sealing resin;
a second conductive layer provided on a side surface of the sealing resin; and
a slot antenna provided across the first conductive layer, the second conductive layer, and the conductive portion of the interposer; wherein
a first part of the slot antenna is longer than a second part of the slot antenna, the first part provided on the first conductive layer, the second part provided on the conductive portion of the interposer, and
a total length of the slot antenna is longer than a length of a long side of the interposer.

6. The apparatus according to claim 5, wherein
the top surface of the sealing resin being in parallel to the component mounting surface of the interposer, and
the side surface of the sealing resin being perpendicular to the component mounting surface of the interposer.

7. The apparatus according to claim 5, wherein
the slot antenna is not overlapped with the semiconductor chip when viewed in a vertical direction with respect to the top surface of the sealing resin.

8. The apparatus according to claim 5, wherein both ends of the slot antenna are located on the first conductive layer.

9. A wireless apparatus comprising:
an interposer including a conductive portion;
a semiconductor chip mounted on a component mounting surface of the interposer;
a sealing resin provided to contact with the interposer and seal the semiconductor chip;
a first conductive layer provided on a top surface of the sealing resin;
a second conductive layer provided on a side surface of the sealing resin; and
a slot antenna provided across the first conductive layer, the second conductive layer, and the conductive portion of the interposer; wherein
a first part of the slot antenna is longer than a second part of the slot antenna, the first part provided on the first conductive layer, the second part provided on the conductive portion of the interposer, and
the slot antenna is not overlapped with the semiconductor chip when viewed in a vertical direction with respect to the top surface of the sealing resin and not overlapped with the semiconductor chip when viewed in a vertical direction with respect to the side surface of the sealing resin.

10. The apparatus according to claim 9, wherein
the top surface of the sealing resin being in parallel to the component mounting surface of the interposer, and
the side surface of the sealing resin being perpendicular to the component mounting surface of the interposer.

11. The apparatus according to claim 9, wherein
both ends of the slot antenna are located on the first conductive layer.

* * * * *